United States Patent [19]

Komaru et al.

[11] Patent Number: 5,225,707
[45] Date of Patent: Jul. 6, 1993

[54] INSULATED VIA HOLE STRUCTURE FOR SEMICONDUCTOR DEVICES

[75] Inventors: Makio Komaru; Michihiro Kobiki, both of Itami, Japan

[73] Assignee: Mitsubishi Denki Kabushiki Kaisha, Tokyo, Japan

[21] Appl. No.: 700,436

[22] Filed: May 15, 1991

[30] Foreign Application Priority Data

Jun. 5, 1990 [JP] Japan .................................. 2-148181

[51] Int. Cl.⁵ ...................... H01L 28/18; H01L 23/50
[52] U.S. Cl. ................................. 257/513; 257/514; 257/374; 257/520
[58] Field of Search ........................ 357/49, 55, 67, 48, 357/68; 257/513, 514, 374, 244, 466, 520

[56] References Cited

U.S. PATENT DOCUMENTS

| | | | |
|---|---|---|---|
| 3,969,745 | 7/1976 | Blocker, III | 357/22 |
| 3,986,196 | 10/1976 | Decker et al. | 357/22 |
| 4,646,118 | 2/1987 | Takemae | 357/55 |
| 4,796,070 | 1/1989 | Black | 357/23.4 |
| 4,868,613 | 9/1989 | Hirachi | 357/49 |
| 4,937,202 | 6/1990 | Maas | 357/55 |
| 4,939,568 | 7/1990 | Kato et al. | 357/49 |
| 5,017,999 | 5/1991 | Roisen et al. | 357/55 |
| 5,021,845 | 6/1991 | Hashimoto | 357/55 |
| 5,025,295 | 6/1991 | Kuesters et al. | 357/55 |
| 5,029,321 | 7/1991 | Kimura | 357/55 |
| 5,105,253 | 4/1992 | Pollock | 357/49 |

FOREIGN PATENT DOCUMENTS 64-80059 3/1989 Japan .

OTHER PUBLICATIONS

Sumitani et al., "A High Aspect Ratio Via Hole Dry Etching Technology For High Power GaAs MESFET", IEEE GaAs IC Symposium, Oct. 1989, pp. 207-210.
Kobiki et al., "A Ka-Band GaAs Power MMIC", IEEE Monolithic Circuits Symposium, 1985, pp. 31-34.

Primary Examiner—Rolf Hille
Assistant Examiner—S. V. Clark
Attorney, Agent, or Firm—Leydig, Voit & Mayer

[57] ABSTRACT

A semiconductor device includes a semiconductor substrate, first and second semiconductor layers of opposite conductivity types successively disposed on the semiconductor substrate, and a via hole structure including a hole penetrating through the first and second semiconductor layers and into the substrate, the via holes being defined by a side wall of the first and second layers and of the substrate, an electrically conducting material disposed on the side wall contacting the first and second semiconductor layers, and an electrically isolating region disposed in the first and second layers at the side wall and contacting the electrically conducting material. The electrically isolating region is formed with an ion flux applied either before or after etching of the via hole.

9 Claims, 5 Drawing Sheets

INSULATED VIA HOLE STRUCTURE FOR SEMICONDUCTOR DEVICES

FIELD OF THE INVENTION

The present invention relates to an improved via hole structure for semiconductor devices, particularly for field effect transistors, improved semiconductor devices that include the improved via hole structure, and a method of manufacturing the improved via hole structures.

BACKGROUND OF THE INVENTION

FIG. 5 is a cross-sectional view of a conventional field effect transistor made of compound semiconductor materials. The cross-sectional view of FIG. 5 shows one transistor and part of another transistor that are part of a larger group of interconnected transistors formed on a common substrate.

The transistor includes a semi-insulating substrate 1, for example, gallium arsenide, on which are successively disposed a buffer layer 2 and an active layer 3. Layers 2 and 3 are of opposite conductivity types and generally the active layer 3 is n-type. A source electrode 4, a gate electrode 5, and a drain electrode 6 are disposed on the active layer 3. The amount of current flowing between the source and drain electrodes through the active layer 3 is controlled by the signal applied to the gate electrode 5 which generally forms a Schottky barrier with the active layer 3.

The substrate 1 is disposed on a plated heat sink (PHS) 7 which is grounded in most circuitry including the illustrated structure. Likewise, the source electrode 4 is usually grounded. The ground connection from the source electrode 4 to the PHS 7 is made through a via hole structure 8. The via hole structure 8 includes a hole penetrating through the active layer 3, the buffer layer 2, and the substrate 1 to the PHS 7, the hole being defined by a side wall 9 of those layers and the substrate, and an electrically conducting material 10, such as gold, disposed within the via hole contacting the side wall 9, the PHS 7, and the source electrode 4. The electrically conducting material 10 electrically connects the source electrode 4 to the PHS 7. The via hole structure 8 provides a relatively low inductance ground connection for the source electrode 4. The drain electrode 6 is connected through a metallization 11 to another part of the circuit. The electrically conducting material 10 also connects the source electrode 4 to another source electrode 4 of an adjacent transistor.

In the conventional device, the via hole structure 8 is formed after the buffer layer 2 and active layer 3 are grown on the substrate 1. Using conventional photolithographic techniques, before or after the PHS 7 is formed, the via hole is etched through the substrate and the buffer and active layers. After the deposition of the source electrode 4 and etching of the via hole, the electrically conducting material 10 is deposited in the via hole and in contact with the source electrode 4 using conventional techniques, such as vapor deposition and lift-off.

In the conventional field effect transistor of FIG. 5, both the buffer layer 2 and the active layer 3 are directly in contact with the electrically conducting material 10 of the via hole structure 8. A pn junction is formed between the active layer 3 and the buffer layer 2. Generally, current flowing in the active layer 3 between the source and drain electrodes is discouraged from flowing into or out of the buffer layer 2 by at least one o the pn junctions lying below the source electrode 4 and the drain electrode 6. Ordinarily, at least one of those junctions is reverse biased. However, the adjacent electrically conducting material 10 of the via hole structure 8 can short-circuit the reverse biased junction that lies below the source electrode 4. Therefore, under certain biasing conditions, an undesirable leakage current can flow between the drain electrode 6 and the source electrode 4 through the active layer 3, the buffer layer 2, and the electrically conducting material 10.

SUMMARY OF THE INVENTION

An object of the invention is to eliminate the flow of leakage current between semiconductor layers of opposite conductivity types that are contacted by the electrically conducting material of a via hole structure.

It is a further object of the invention to provide a field effect transistor including a source or drain electrode electrically connected by a via hole structure to the rear surface of the substrate of the field effect transistor without an undesired current flow between the grounded electrode and the other of the source and drain electrodes through a current path including the electrically conducting material of the via hole structure.

According to one aspect of the invention, a semiconductor device comprises a semiconductor substrate, first and second semiconductor layers of opposite conductivity types successively disposed on the semiconductor substrate, and a via hole structure including a hole penetrating through the first and second semiconductor layers and into the substrate, the hole being defined by a side wall of the first and second layers and of the substrate, an electrically conducting material disposed on the side wall contacting the first and second semiconductor layers, and an electrically isolating region disposed in the first and second layers at the side wall and contacting the electrically conducting material of the via hole structure.

According to another aspect of the invention, a semiconductor device is made by depositing first and second semiconductor layers of opposite conductivity types on a semiconductor substrate, exposing the second semiconductor layer to a flux of ions to produce an electrically isolating region in and penetrating through the first and second semiconductor layers and into the semiconductor substrate, etching a via hole penetrating through the first and second semiconductor layers within the electrically isolating region and into the semiconductor substrate, thereby exposing a side wall of the first and second semiconductor layers within the electrically isolating region, and depositing an electrically conducting material in the via hole in contact with the side wall of the first and second semiconductor layers at the electrically isolating region, thereby completing a via hole structure in which the first and second semiconductor films are not electrically connected through the electrically conducting material.

According to a still further aspect of the invention, a method of making a semiconductor device includes depositing first and second semiconductor layers of opposite conductivity types on a semiconductor substrate, etching a via hole penetrating through the first and second semiconductor layers and into the semiconductor substrte, thereby exposing a side wall of the first and second semiconductor layers, exposing the surface of the second semiconductor layer to a flux of ions to produce an electrically isolating region in and penetrating through the first and second semiconductor layers and into the semiconductor substrate surrounding the via hole to produce an electrically isolating region adjacent the side wall, and depositing an electrically conducting material in the via hole in contact with the side wall of the first and second semiconductor layers at the electrically isolating region, thereby completing a via hole structure in which the first and second semiconductor films are not electrically connected through the electrically conducting material.

Other objects and advantages of the present invention will become apparent from the detailed description given hereinafter. The detailed description and specific embodiments are provided for illustration only, wince various additions and modifications within the spirit and scope of the invention will become apparent to those of skill in the art from the detailed description.

DESCRIPTION OF THE PREFERRED EMBODIMENTS

Figure 1:
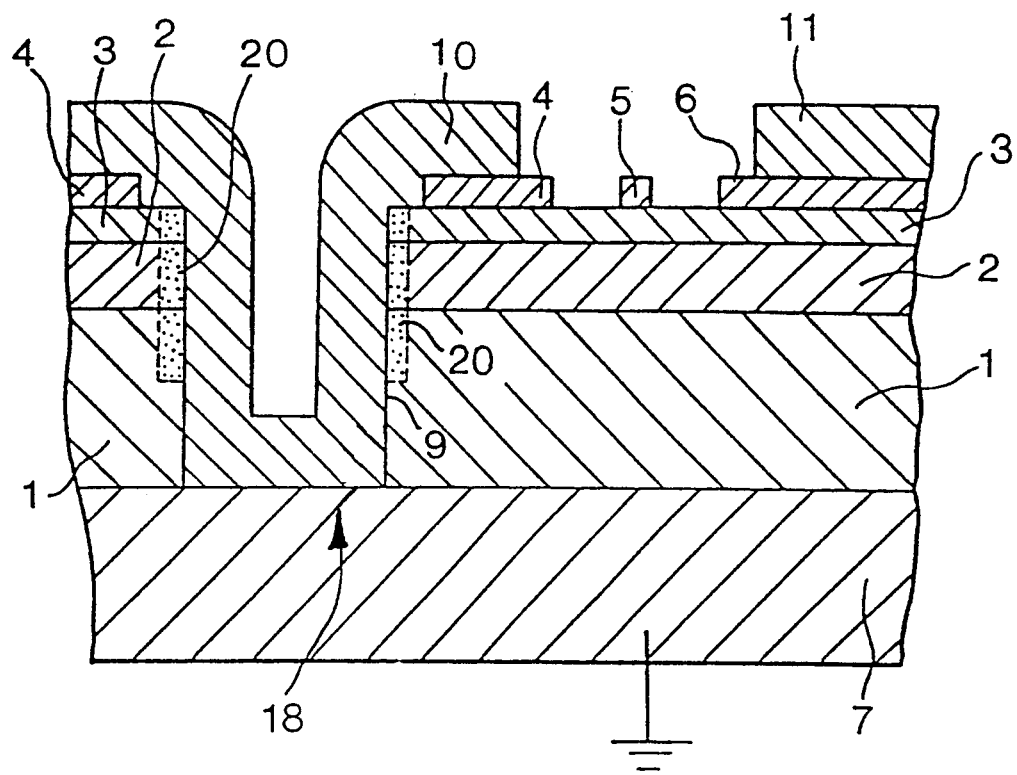
FIG. 1 is a cross-sectional view of a semiconductor device including a via hole structure according to an embodiment of the present invention.

FIG. 1 is a cross-sectional view of a field effect transistor including a via hole structure in accordance with an embodiment of the invention. In all figures, the same elements are given the same reference numerals. In the structure shown in FIG. 1, a semiconductor substrate 1, for example, semi-insulating gallium arsenide, may be 30 to 150 microns thick. The buffer layer 2, which has an opposite conductivity type from that of the active layer 3, is typically about 1 micron thick. The active layer 3 is relatively thin, for example, several hundred nanometers thick.

Figure 5:
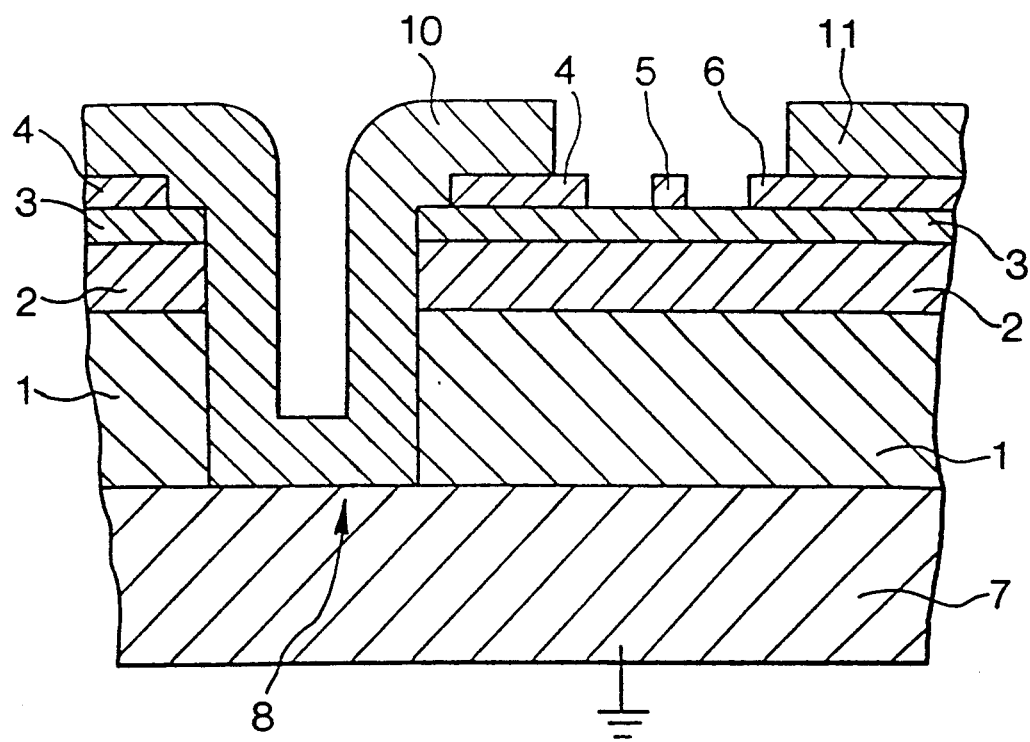
FIG. 5 is a cross-sectional view of a conventional semiconductor device including a conventional via hole structure.

The via hole structure 18 includes a via hole penetrating through the active layer 3, the buffer layer 2, and the substrate 1. An electrically conducting material 10, such as gold, is deposited in the via hole in contact with the via hole side wall 9 in the substrate and the buffer and active layers and in contact with the source electrode 4. In addition, unlike the via hole structure 8 of FIG. 5, the via hole structure 18 of FIG. 1 includes an electrically isolating region 20 extending from the side wall 9 into the active layer 3, the buffer layer 2, and part of the substrate 1.

The electrically isolating region 20 is produced by subjecting the region adjacent to the via hole to a flux of protons, i.e., hydrogen ions, oxygen ions, or the like. It is well known that a flux of protons damages a single crystal semiconductor material, causing the formation of an electrically insulating region where the protons are incident. Likewise, incident oxygen ions cause the crystalline semiconductor materials to form electrically insulating or semi-insulating regions where those ions are incident either by damaging the crystal and/or producing deep impurity levels. The flux of protons, oxygen ions, or the like is directed against the substrate and restricted to the area of the via hole to form the electrically isolating region 20 using the same techniques employed in ion implantation doping. Typically, the electrically isolating region 20 has a depth from the surface at which the ions are incident of 2 to 50 microns and, therefore, penetrates through the active layer and the buffer layer and into the substrate.

The electrically isolating region 20 prevents the electrically conducting material 10 of the via hole structure 18 from short-circuiting the pn junction between the active layer 3 and the buffer layer 2. Therefore, regardless of the electrical bias that is applied across the source and drain electrodes, leakage current is prevented from flowing along a path through the active layer 3, the opposite conductivity type buffer layer 2, and the electrically conducting material 10 of the via hole structure 18 to the source electrode 4.

Figure 2:
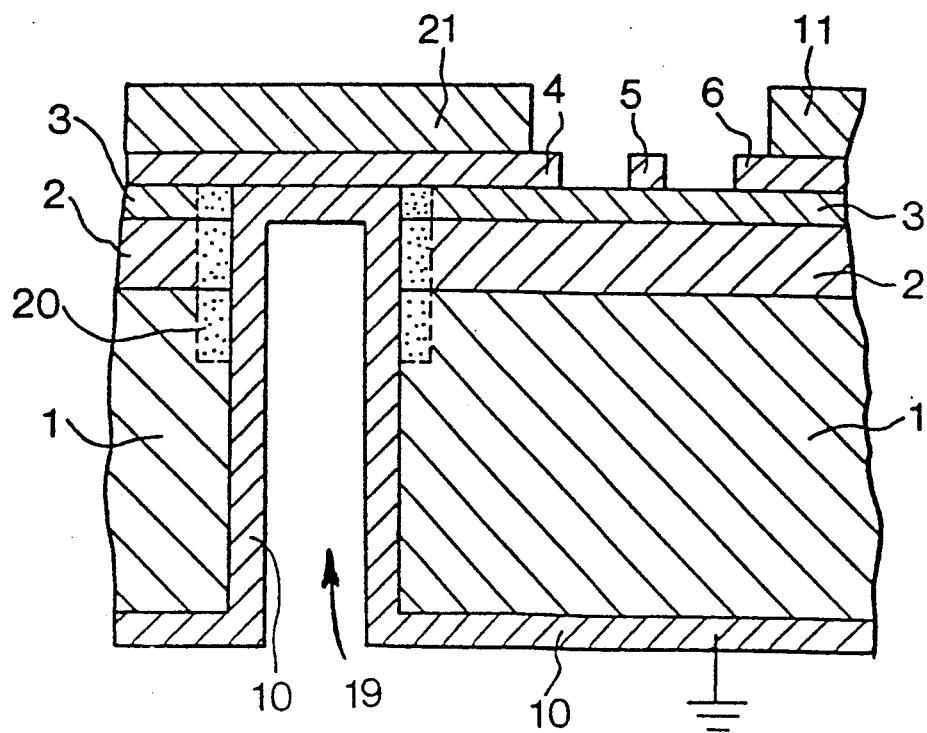
FIG. 2 is a cross-sectional view of a semiconductor device including a via hole structure according to an embodiment of the present invention.

FIG. 2 is a cross-sectional view of an alternative structure of a semiconductor device including a via hole structure 19 according to another embodiment of the invention. In the structure of FIG. 1, the via hole extends from the surface of the device, i.e., the active layer 3, where the source, gate, and drain electrodes are disposed, through the substrate 1 to the PHS 7. In the structure of FIG. 2, the via hole extends from the rear of the substrate 1 to the surface of the active layer 3 on which the source, gate, and drain electrodes are disposed. There is no PHS 7 present in the structure of FIG. 2. Rather, the electrically conducting material 10 of the via hole structure 19 is continuous both within the via hole and on the rear surface of the substrate 1 to provide a ground connection. Because of the difference in the via hole structure, an electrode 21 extends to the source electrode 4, a connection that is provided by the electrically conducting material 10 in the structure of FIG. 1. The same leakage current flow prevention is achieved in the structure of FIG. 2 as is achieved with the structure of FIG. 1.

The foregoing embodiments have been described with respect to grounding of the source electrode of a field effect transistor. Alternatively, the drain electrode could be grounded. Moreover, although the examples refer to a gallium arsenide transistor, the via hole structure described may be employed with devices made from other compound semiconductor materials, such as indium phosphide, and elemental semiconductors, such as silicon. The invention is not limited to a particular semiconductor material or to a particular semiconductor device, such as a field effect transistor, but has wider utility in the semiconductor arts.

Figure 3A:
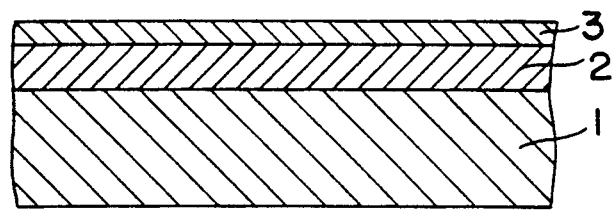
FIGS. 3(a)-3(d) illustrate steps in a method of making a via hole structure according to an embodiment of the invention.

FIGS. 3(a)-3(d) and FIGS. 4(a)-4(d) schematically illustrate two alternative methods of forming a via hole structure with an electrically isolating region that prevents current leakage between layers adjacent to and contacting the electrically conducting layer of the via hole structure. In FIG. 3(a), after the growth of the buffer layer 2 and the active layer 3 of opposite conductivity types, the source, gate, and drain electrodes are formed on the active layer.

Figure 3B:
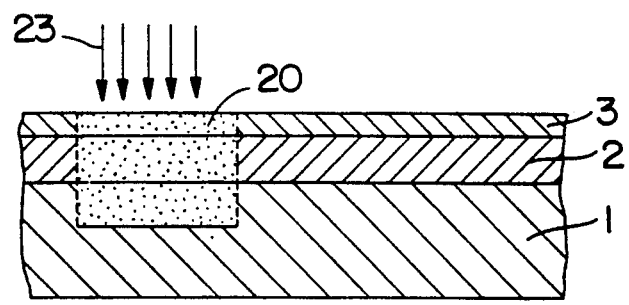

As indicated in FIG. 3(b), a flux 23 of protons or oxygen ions or another species for producing a high resistivity or semi-insulating region in the active and buffer layers and in the substrate is incident on a limited portion of the active layer defined by a mask (not shown). The ions penetrate the active layer, the buffer layer, and into the substrate, producing an electrically insulating or semi-insulating electrically isolating region 20.

Figure 3C:
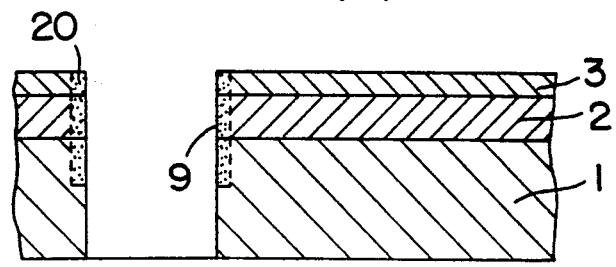
Figure 3D:
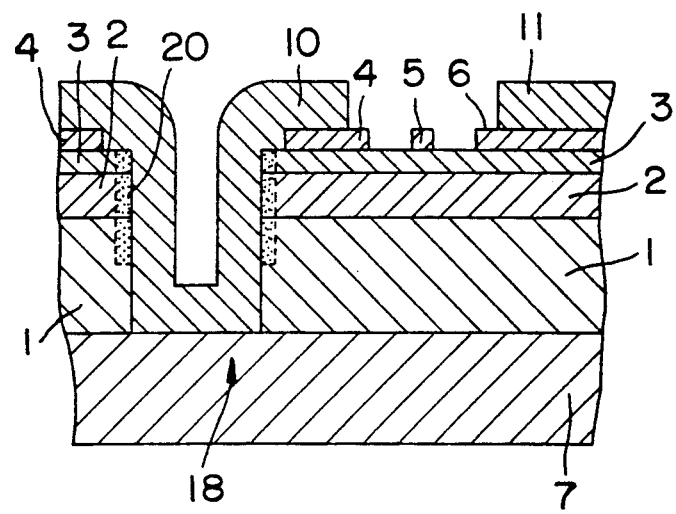

As illustrated in FIG. 3(c), after a mask (not shown) is patterned, the via hole is formed by an etching step that exposes the side wall 9. The etching of the active layer 3 and buffer layer 2 is confined to the high resistivity region, leaving the electrically isolating region 20 at the side wall 9 that defines the via hole. Thereafter, as illustrated in FIG. 3(d), using conventional plating techniques, the electrically conducting material 10 of the via hole structure is deposited in the via hole and on the side wall 9 as well as in contact with the source electrode 4, completing the via hole structure. FIG. 3(d) also shows a field effect transistor formed in conjunction with the via hole structure 18, including a PHS at the rear surface of the substrate 1.

Figure 4A:
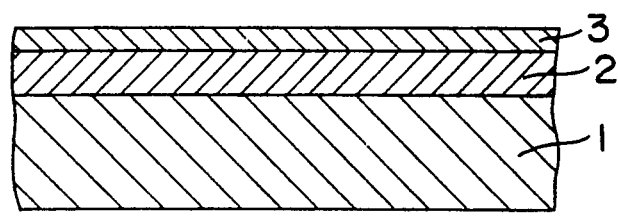
FIGS. 4(a)-4(d) illustrate steps in a method of making a via hole structure according to an embodiment of the invention.
Figure 4B:
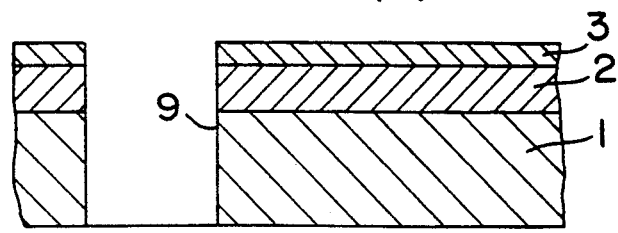
Figure 4C:
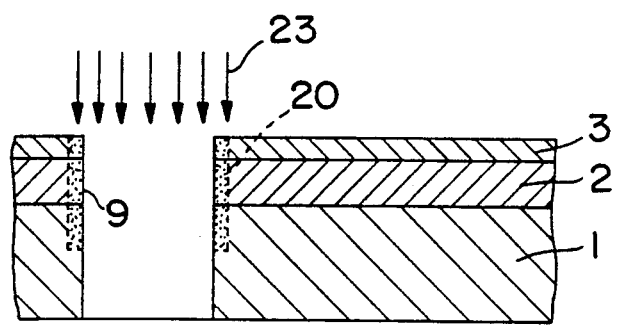
Figure 4D:
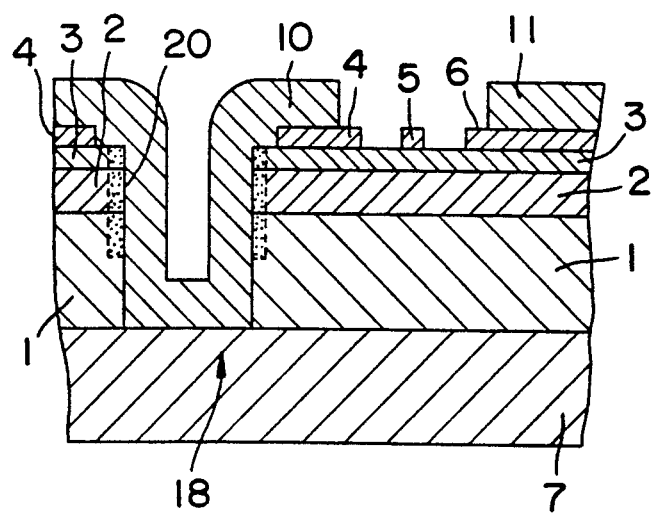

The same process is illustrated in FIGS. 4(a)-4(d) except that the sequence of the implantation and etching steps is reversed. FIG. 4(a) is the same as FIG. 3(a). As illustrated in FIG. 4(b), the via hole is etched using conventional photolithographic masking techniques to expose side wall 9. Thereafter, as indicated in FIG. 4(c), the ion flux 23 that produces the high resistivity or semi-insulating region 20 at the periphery of the via hole is incident on the structure. Finally, the plating step of FIG. 4(d) is carried out to deposit the electrically conducting material 10 of the via hole structure 18. FIG. 4(d) is identical to FIG. 3(d) and includes a field effect transistor as well as a PHS 7.

FIGS. 3(a)-3(d) and 4(a)-4(d) particularly relate to the structure shown in FIG. 1. Similar steps are carried out in manufacturing the structure of FIG. 2. As is apparent from FIG. 2, the ion flux is incident on the active layer 3 to form the electrically isolating region 20. If the via hole is to be etched after the ion treatment, then an alignment of an etching mask with the electrically isolating region must be made from the rear surface of substrate, the surface opposite the surface on which the ion flux is incident. However, neither this alignment step, which may be carried out with infrared light when the substrate is gallium arsenide, nor the other manufacturing processes described here that require alignments of etching masks, ion implantation masks, lift-off masks, and ion fluxes present any unusual alignment problems. Satisfactory alignments can be achieved with established semiconductor device processing technology. Thus, in accordance with the invention, a via hole structure including an electrically isolating region in semiconductor layers and adjacent to a via hole can be reliably formed to prevent short-circuiting of adjacent opposite conductivity type semiconductor layers in a field effect transistor or other semiconductor device structure by the electrically conducting material that is part of the via hole structure.

I claim:

1. A semiconductor device comprising:
   a semiconductor substrate;
   first and second semiconductor layers of opposite conductivity types successively disposed on the semiconductor substrate; and
   a via hole structure including a hole penetrating through the first and second semiconductor layers and into the substrate, the hole being defined by a side wall of the first and second layers and of the substrate, an electrically conducting material disposed on the side wall directly contacting the first and second semiconductor layers, and an electrically isolating region of the first and second semiconductor layers adjacent to the side wall and directly contacting the electrically conducting material, whereby the electrically conducting material is electrically isolated from the first and second semiconductor layers.

2. The semiconductor device of claim 1 including a source electrode, a gate electrode, and a drain electrode all disposed on the second semiconductor layer wherein the electrically conducting material is in electrical contact with one of the source and drain electrodes.

3. The semiconductor device of claim 2 wherein the substrate is a semi-insulating substrate.

4. The semiconductor device of claim 2 wherein the substrate is selected from the group consisting of gallium arsenide and indium phosphide.

5. The semiconductor device of claim 2 wherein the substrate is silicon.

6. The semiconductor device of claim 2 including a plated heat sink disposed on the substrate opposite the first semiconductor layer.

7. The semiconductor device of claim 6 wherein the via hole penetrates through the substrate to the plated heat sink and the electrically conducting material electrically connects the plated heat sink to one of the source and drain electrodes.

8. The semiconductor device of claim 2 wherein a metallic plating is disposed on the surface of the substrate opposite the first semiconductor layer and is continuous with the electrically conducting material of the via hole structure.

9. The semiconductor device of claim 1 wherein the electrically conducting material disposed on the side wall contacting the first and second semiconductor layers is a metal.

* * * * *